(12) United States Patent
Sharma et al.

(10) Patent No.: US 10,410,867 B2
(45) Date of Patent: Sep. 10, 2019

(54) CONFINED AND SCALABLE HELMET

(71) Applicant: Intel Corporation, Santa Clara, CA (US)

(72) Inventors: Vyom Sharma, Portland, OR (US); Rohan K. Bambery, Hillsboro, OR (US); Christopher P. Auth, Portland, OR (US); Szuya S. Liao, Hillsboro, OR (US); Gaurav Thareja, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/769,452

(22) PCT Filed: Dec. 26, 2015

(86) PCT No.: PCT/US2015/000373
§ 371 (c)(1),
(2) Date: Apr. 19, 2018

(87) PCT Pub. No.: WO2017/111816
PCT Pub. Date: Jun. 29, 2017

(65) Prior Publication Data
US 2018/0315607 A1 Nov. 1, 2018

(51) Int. Cl.
*H01L 21/28* (2006.01)
*H01L 29/78* (2006.01)
(Continued)

(52) U.S. Cl.
CPC ............ *H01L 21/28132* (2013.01); *H01L 21/823431* (2013.01); *H01L 21/823468* (2013.01); *H01L 27/0886* (2013.01); *H01L 29/4983* (2013.01); *H01L 29/66545* (2013.01); *H01L 29/785* (2013.01)

(58) Field of Classification Search
CPC ....... H01L 21/28132; H01L 21/823431; H01L 21/823468; H01L 29/4983; H01L 29/66545; H01L 27/0886
See application file for complete search history.

(56) References Cited

U.S. PATENT DOCUMENTS 8,981,481 B2  3/2015  Hafez et al.
9,184,294 B2  11/2015  Cea et al.
(Continued)

OTHER PUBLICATIONS

The International Searching Authority, Written Opinion of the International Searching Authority and the International Search Report dated Aug. 24, 2016 in International Application No. PCT/US2015/000373, eight pages.

*Primary Examiner* — Ahmed N Sefer
(74) *Attorney, Agent, or Firm* — Trop, Pruner & Hu, P.C.

(57) ABSTRACT

An embodiment includes a system comprising: a first gate and a first contact that correspond to a transistor and are on a first fin; a second gate and a second contact that correspond to a transistor and are on a second fin; an interlayer dielectric (ILD) collinear with and between the first and second contacts; wherein (a) the first and second gates are collinear and the first and second contacts are collinear; (b) the ILD includes a recess that comprises a cap layer including at least one of an oxide and a nitride. Other embodiments are described herein.

23 Claims, 11 Drawing Sheets

(51) Int. Cl.
    *H01L 29/66*    (2006.01)
    *H01L 21/8234*    (2006.01)
    *H01L 27/088*    (2006.01)
    *H01L 29/49*    (2006.01)

(56) References Cited

U.S. PATENT DOCUMENTS

| | | | |
|---|---|---|---|
| 9,633,835 B2 * | 4/2017 | Glass | H01L 21/02175 |
| 2012/0012935 A1 | 1/2012 | Kaneko et al. | |
| 2012/0205742 A1 | 8/2012 | Iyer et al. | |
| 2013/0134522 A1 * | 5/2013 | Bhuwalka | H01L 21/823431 257/369 |
| 2014/0203376 A1 * | 7/2014 | Xie | H01L 21/76224 257/401 |
| 2014/0252477 A1 * | 9/2014 | Tseng | H01L 29/66795 257/347 |
| 2015/0021699 A1 * | 1/2015 | Ando | H01L 21/823431 257/368 |
| 2015/0179770 A1 | 6/2015 | Hong et al. | |
| 2016/0351677 A1 * | 12/2016 | Bao | H01L 29/495 |
| 2017/0170320 A1 * | 6/2017 | Chang | H01L 29/0653 |
| 2017/0229342 A1 * | 8/2017 | Glass | H01L 29/41775 |

* cited by examiner

CONFINED AND SCALABLE HELMET

TECHNICAL FIELD

Embodiments of the invention are in the field of semiconductor devices and, in particular, non-planar transistors.

BACKGROUND

A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIG. 2(*j*) depicts a conventional RMG processing stage;

DETAILED DESCRIPTION

Figure 1A:
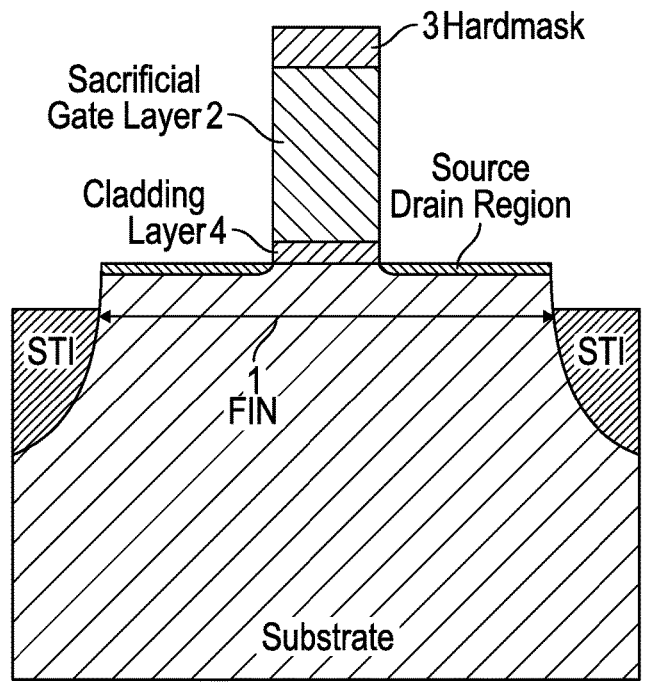
FIGS. 1(*a*)-(*b*) depict conventional remove metal gate (RMG) processing stages.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

U.S. Pat. No. 9,184,294, assigned to Intel Corp., Santa Clara, Calif., U.S.A., addresses a process for forming a gate stack using a remove metal gate (RMG) process. In general, once fins are formed, a sacrificial gate material can be deposited on fins (which are cladded in embodiments described in the above mentioned patent but need not necessarily be cladded to still be considered a RMG process). In some cases, a sacrificial gate dielectric material may be deposited on the fins, and then the sacrificial gate material is deposited on the sacrificial gate dielectric material. The deposited sacrificial gate material can then be planarized to remove any undesired topology and/or excess sacrificial gate material. A hardmask can then be provisioned and patterned on the sacrificial gate material layer, as typically done, followed by an etch process that results in the formation of sacrificial gate stacks (FIG. 1(*a*)).

Patterning of the sacrificial gate material can be carried out, for example, from a single depth of focus due to pre-patterning planarization of the sacrificial material layer, and using standard photolithography including deposition of hardmask materials (e.g., such as SiO2, SiN, and/or other suitable hardmask materials) on the sacrificial gate material, patterning resist on a portion of the hardmask that will remain temporarily to protect the underlying gate region of the device, etching to remove the unmasked (no resist) portions of the hardmask (e.g., using a dry etch, or other suitable hardmask removal process), and then stripping the patterned resist, thereby leaving the patterned gate mask (FIG. 1(*a*)). The hardmask may be implemented with SiN (e.g., 100 Å to 500 Å thick) but any number of suitable hardmask configurations can be used.

Once the gate pattern hardmask is complete, etching can be carried out to remove the non-masked sacrificial gate material (and any remaining dummy gate dielectric material and/or pad oxide) down to the substrate and slightly into the substrate to form the source/drain regions, in accordance with some example embodiments. The etching can be accomplished with standard photolithography and may include, for example, dry etching or any suitable etch process or combination of etches. Note that the source/drain regions may be formed using the gate structure as a mask. In some embodiments, ion implantation may be used to dope the source/drain regions as conventionally done. The geometry of the resulting gate structure (e.g., width, depth, shape) as well as the shape and depth of source/drain regions, can vary from one embodiment to the next.

This gate patterning can be used to simultaneously produce a plurality of such structures where, for example, all the transistors to be formed will be the same, or some transistors are one type/configuration (e.g., PMOS) and the remainder are another type/configuration (e.g., NMOS). The deposition of gate stack materials can be carried out, for example, using CVD or other suitable process. In an example the substrate is a bulk silicon substrate, the recessed STI material is SiO2, the fins are silicon (formed in the substrate), the cladding is SiGe, and the sacrificial gate material is polysilicon. The sacrificial gate material can be any suitable sacrificial material (e.g., polysilicon, silicon nitride, silicon carbide, etc.). In devices that include a sacrificial gate dielectric material, the sacrificial gate dielectric material can be, for instance, SiO2 or any other suitable dummy gate insulator material. Once the sacrificial gate stacks are formed, an RMG process and transistor formation can take place. The end result of such an RMG process, as described in the above mentioned patent, is shown in FIG. 1(b).

Figure 1B:
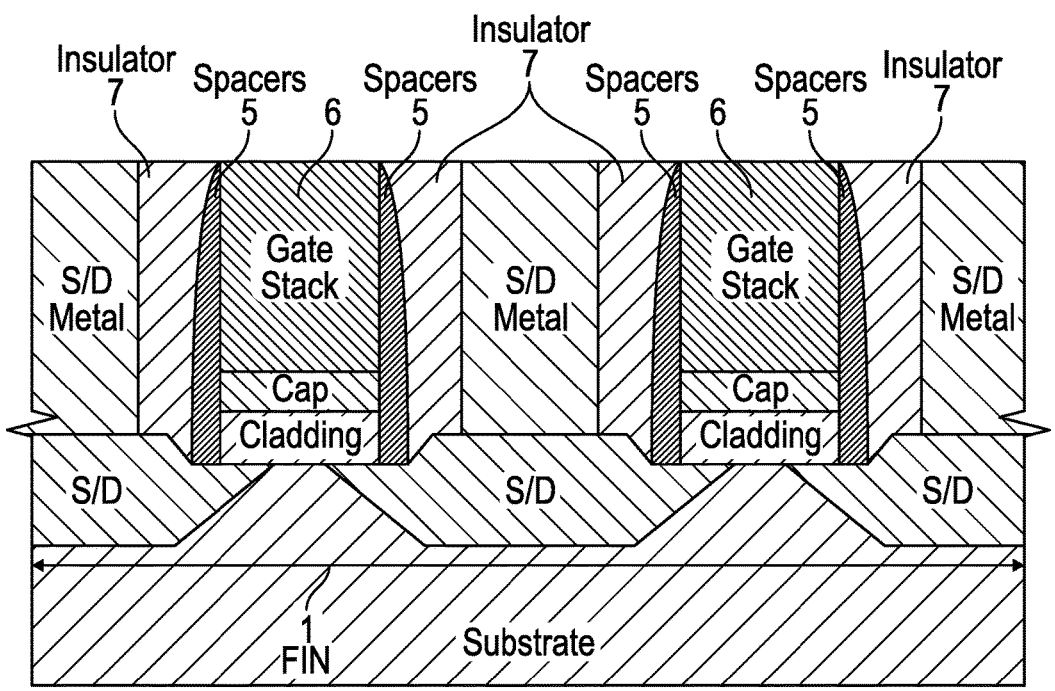

Thus, FIG. 1(a) shows a beginning stage of a FinFET device before the RMG process is complete and FIG. 1(b) shows an end result of the RMG process. Specifically, FIG. 1(a) (perpendicular to the gate and parallel to fin 1) shows a sacrificial gate layer 2 between hardmask 3 and cladding layer 4. The RMG process continues on to generate multiple "dummy gates" (all like the device of FIG. 1(a)) eventually yielding the transistor structure of FIG. 1(b) once those dummy gates are replaced with active gate material. FIG. 1(b) illustrates a cross-sectional side view (perpendicular to the gates and parallel to the fin 1) of an example transistor structure formed with the RMG process. Spacers 5 are adjacent gate stack 6, cap layer, cladding layer, and S/D nodes. Interlayer dielectric (ILD) 7 separates the spacers from S/D metal contacts. The above mentioned patent may be examined for details regarding the RMG process (a process known to those of ordinary skill in the art) and, in particular, FIGS. 1(a) and 1(b).

While RMG processes have met with great success Applicant has determined challenges are ahead as critical dimension (CD) decreases. For example, certain processes are used to deposit protective layers (e.g., "helmets") over portions of, for example, ILD during removal of sacrificial gate material. It can be critical to preserve the ILD to allow for subsequent processing of source/drain (S/D) contacts. Applicant has determined that protective layer processes that rely on conformal atomic layer deposition (ALD) or physical vapor deposition (PVD) to protect certain areas during etching of sacrificial gate material will be particularly impacted as CD decreases.

Specifically, conformal ALD suffers from limitations imposed by dimensions of features present in, for example, the 10 nm node and smaller. The nature of this deposition implies the protecting layer used to shield ILD 7 during removal of dummy gate material (e.g., polysilicon) 2 will be present on the sides of the ILD 7 where it might not be desired and where it will lead to drastic aspect ratio increases, rendering etches ineffective. PVD is commonly used to deposit transition metal nitrides as helmets over ILD 7, however, this technique requires a high aspect ratio and is vulnerable to feature pinching (e.g., where walls of a high aspect ratio recess touch and form a seam). The PVD layer also deposits at full thickness not only on the very top of ILD 7 but also on the sides of the uppermost part of the ILD that is to be protected. This leads to pinching of the trench. Additionally this method requires a high starting aspect (>2.5:1 for height:width or height:length) ratio in order to be viable.

However, an embodiment helps address these issues where multiple materials are present but only certain materials need to be etched (e.g., protecting ILD 7 while etching polysilicon 2). An embodiment employs a protective cap/helmet that can be made from a wide choice of materials (such as transition metal oxides and transition metal nitrides) that are resilient to aggressive dry etches (e.g., etches used to remove dummy gate materials in an RMG process). Such transition metals include, for example, Scandium, Titanium, Vanadium, Chromium, Manganese, Iron, Cobalt, Nickel, Copper, Zinc, Yttrium, Zirconium, Niobium, Molybdenum, Technetium, Ruthenium, Rhodium, Palladium, Silver, Cadmium, Hafnium, Tantalum, Tungsten, Rhenium, Osmium, Iridium, Platinum, Gold, Mercury, Rutherfordium, Dubnium, Seaborgium, Bohrium, Hassium, Meitnerium, Unnunilium, Unununium, and Ununbium.

Another strength of embodiments described herein is that they allow a designer to select the thickness of this cap independently from the critical dimension of the feature since the cap is formed by recessing and polishing (and not by conformal depositions that are sensitive to aspect ratio).

Another advantage is that various embodiments do not require high aspect ratios and can even work on aspect ratios of <1:1 (for height:width or height:length) as is shown herein. As a result, such embodiments are highly scalable and may be used 10 nm. and 7 nm nodes and beyond. For example, Applicant has determined that etch in high AR regions is very challenging (so the etch needs to be aggressive). As a result, the other features exposed during the aggressive etch, which are not desired to be etched, are attacked. A traditional PVD helmet, for example, can be used to protect such features but such a helmet needs a high AR to preferentially deposit on such features. In contrast, an embodiment does not have to have a high AR. In other words, High AR is required for traditional helmets to deposit but is not required for an embodiment. Please note the AR being addressed immediately above is the AR for the feature that should be protected (e.g., ILD) and not the feature that's supposed to be etched (Silicon).

Figure 2A:
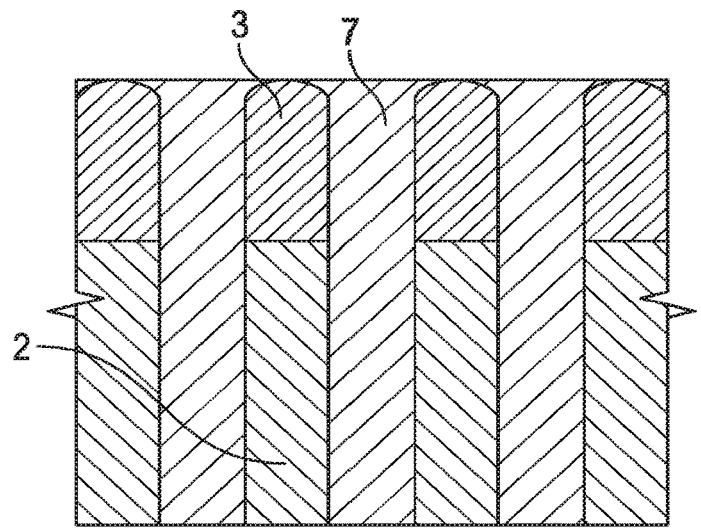
FIGS. 2(*a*)-(*i*) depict a helmet process in an embodiment.

FIGS. 2(a)-(i) depict a process in an embodiment. FIG. 2(a) begins with a flat wafer, with alternating lines of ILD0 7 and dummy polysilicon 2 (covered by nitride hard mask 3). This view is taken parallel to the fin. As used herein "ILD0" connotes ILD in a layer adjacent gates, but other embodiments are not so limited and may include ILD in other layers (e.g., ILD1).

Figure 2B:
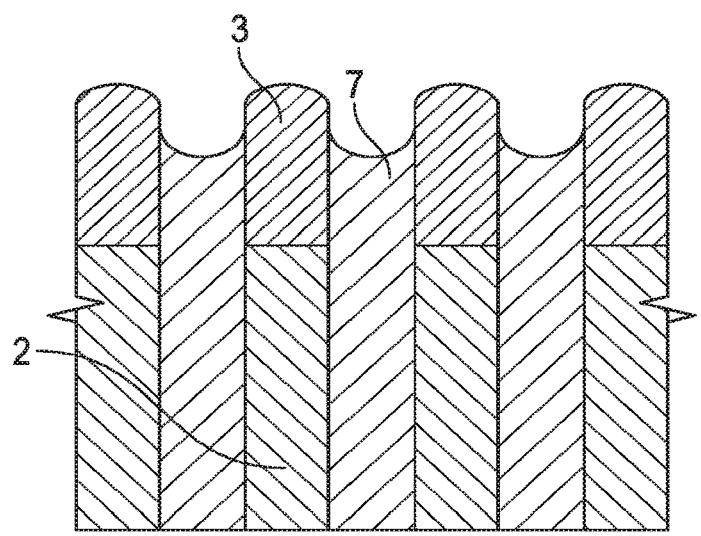
Figure 2C:
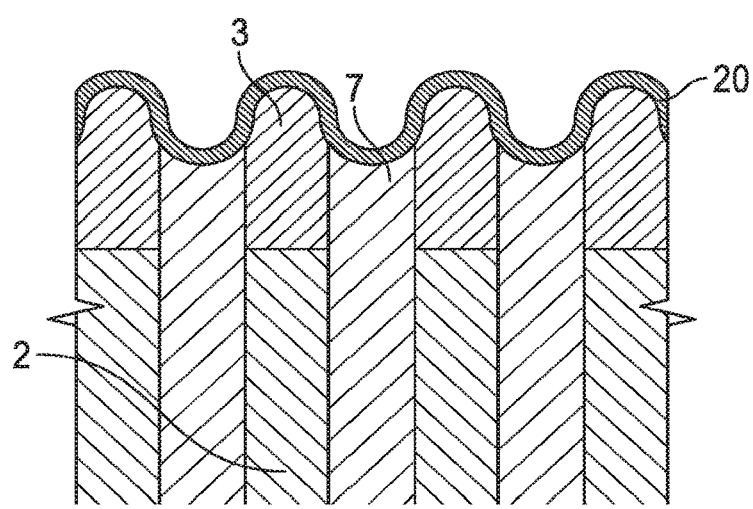

FIG. 2(a) is analogous to FIG. 1(a), however items like the fin are not shown to better illustrate inventive aspects of the embodiment. For example, spacers and the like (see FIG. 1(b)) are also omitted for clarity. In FIG. 2(b) ILD0 lines 7 are recessed using dry or wet etch (e.g., diluted hydrofluoric acid). In FIG. 2(c) these recesses are filled with one or more cap layers according to various embodiments.

Figure 2D:
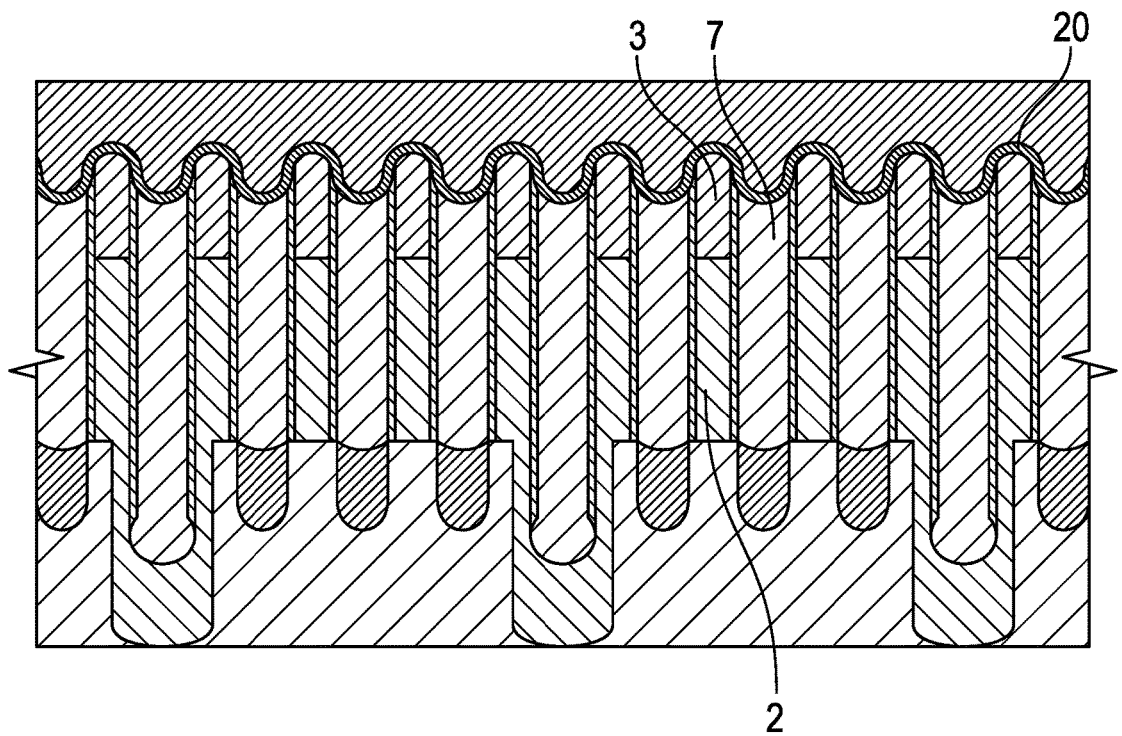

In one embodiment, the layers include a bilayer of an oxide of a first transition metal (transition metal oxide1) and an oxide of a second transition metal (transition metal oxide2). This is depicted in FIGS. 2(c) and 2(d) (where transition metal oxide1=HfOx, depicted as layer 20) and 2(e) (where transition metal oxide2=TiOx, depicted as layer 21). However, in other embodiments transition metal oxide2=TiOx doped with ZrOx. In still other embodiments transition metal oxide2=TiN.

In still other embodiments, layer 20 includes an oxide of a transition metal (transition metal oxide1) and layer 21 includes a nitride of a transition metal (transition metal nitride).

Figure 3A:
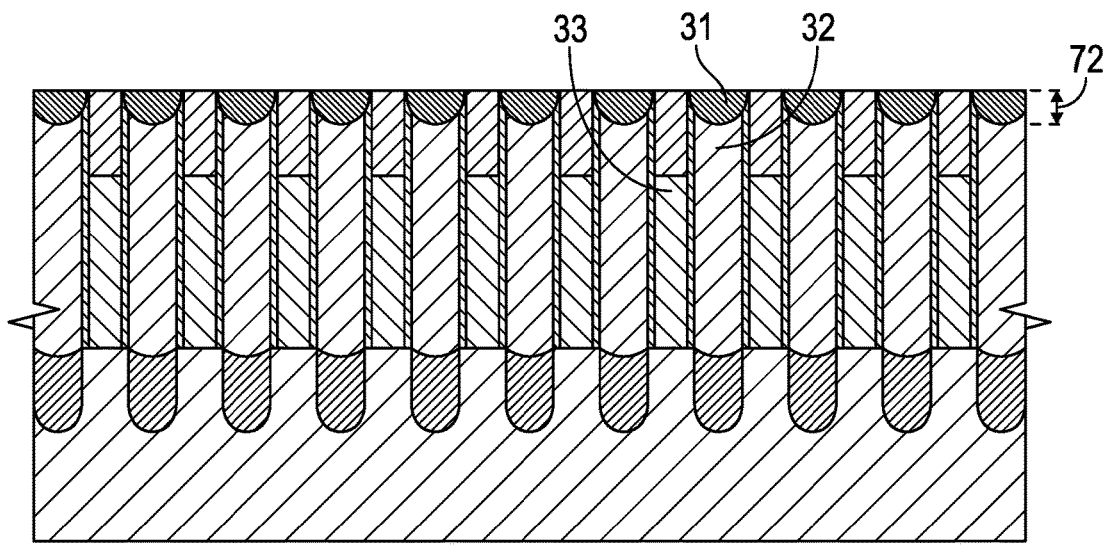
FIGS. 3(*a*)-(*b*) depict a helmet process in an embodiment.

In still other embodiments (e.g., FIG. 3(a)) layer 21 is omitted and layer 20 constitutes a unilayer having an oxide (or a nitride) of a transition metal.

Figure 2E:
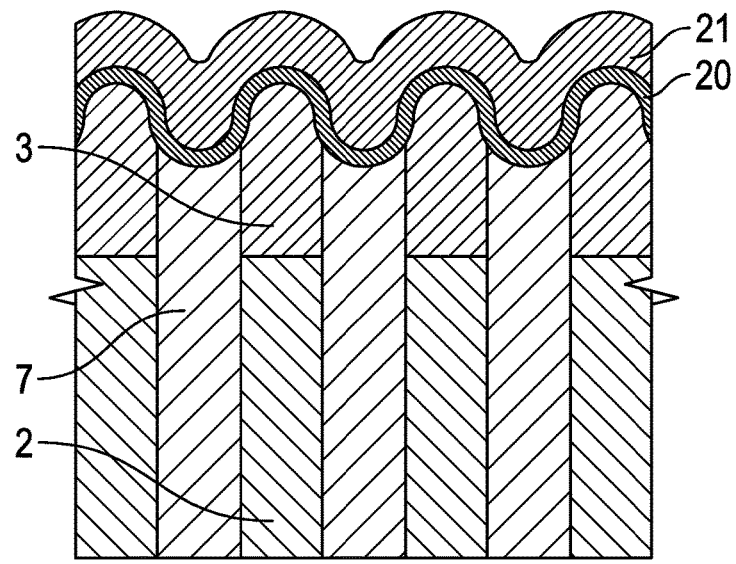
Figure 2F:
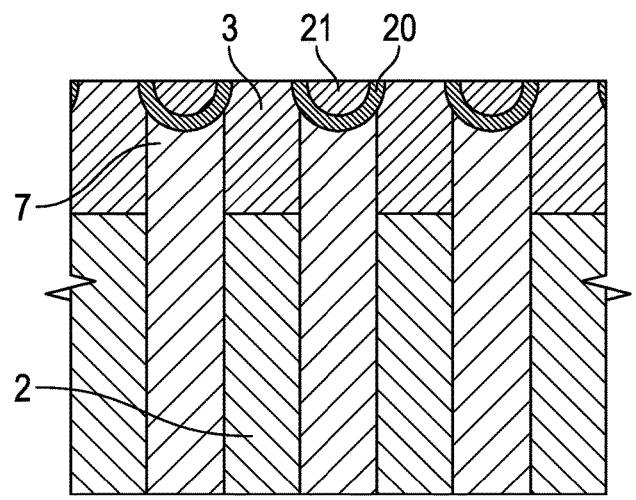
Figure 2G:
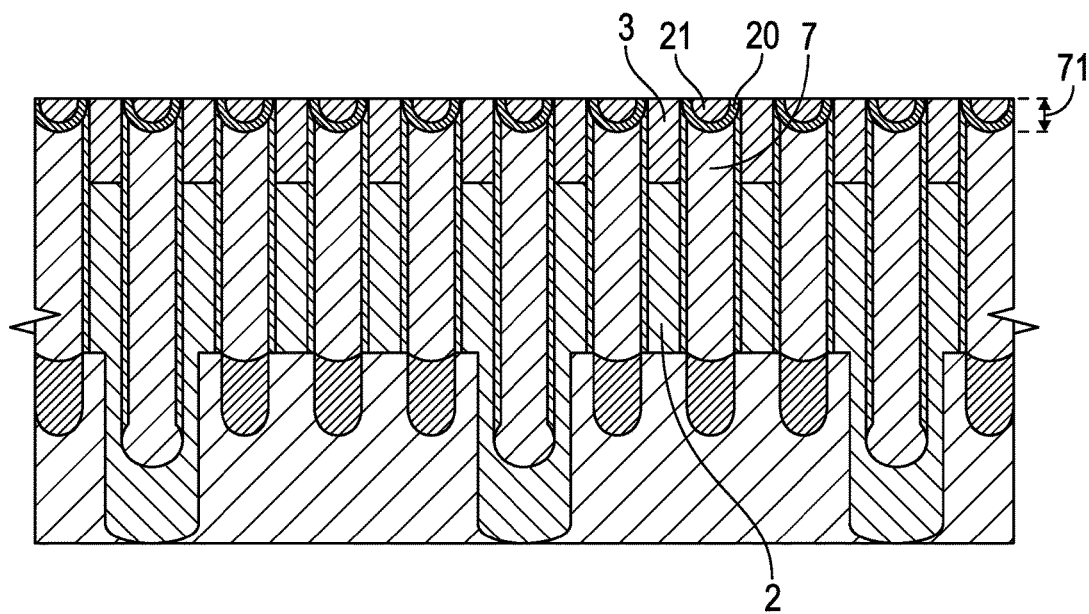

In FIGS. 2(f) and 2(g), once the recess is filled with these cap materials (layers 20, 21), the overburden on the polysilicon/hardmask 3 (as well as portions of the mask itself) is polished off (using Chemical Mechanical Polishing/Planarization (CMP)) and the wafer is planar at the end. As a result, the ILD0 is protected from any damage in downstream processing (e.g., during removal of dummy gate material using aggressive etchants). As shown in FIG. 2(g), an embodiment preserves the helmet/cap only on top of ILD0 (or in other words on top of the feature to be protected).

Figure 2H:
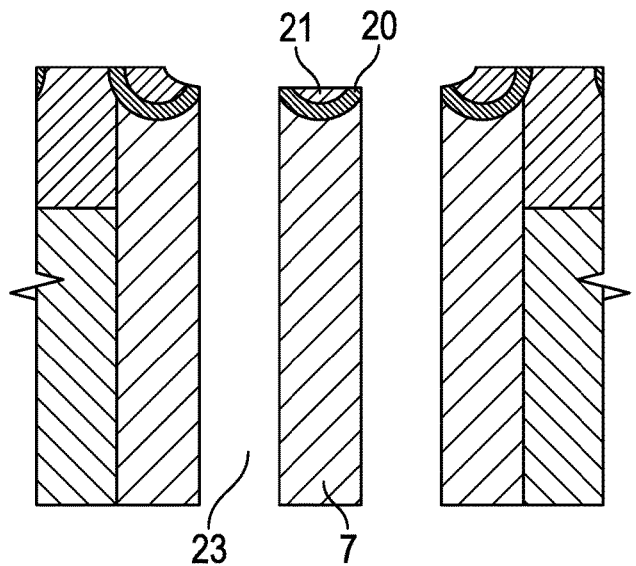
Figure 2I:
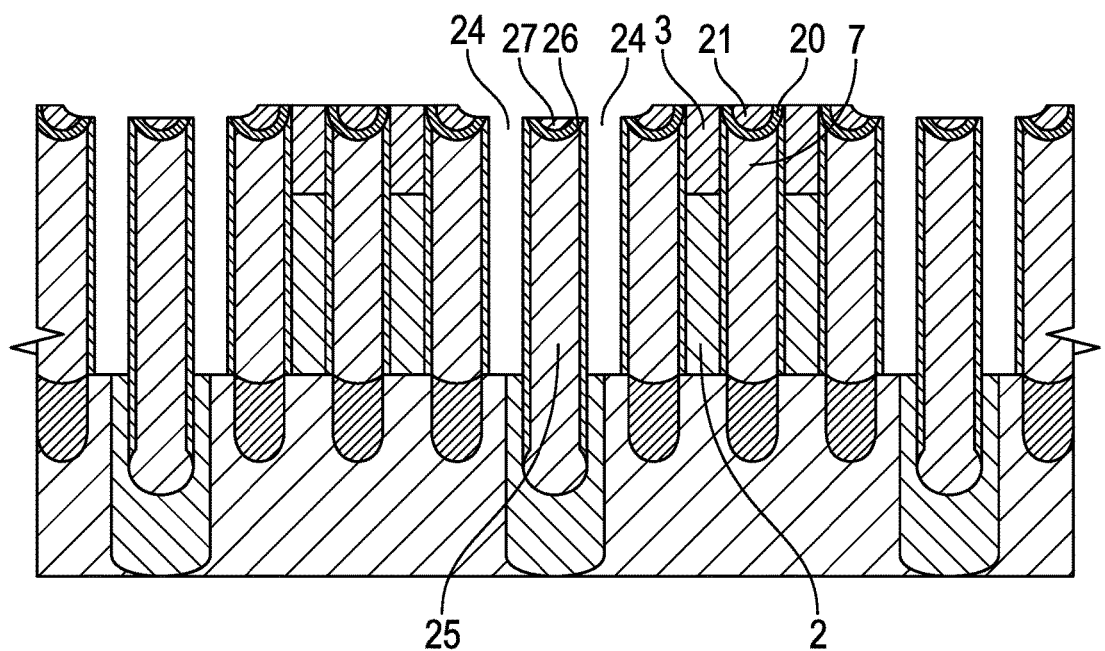
Figure 2J:
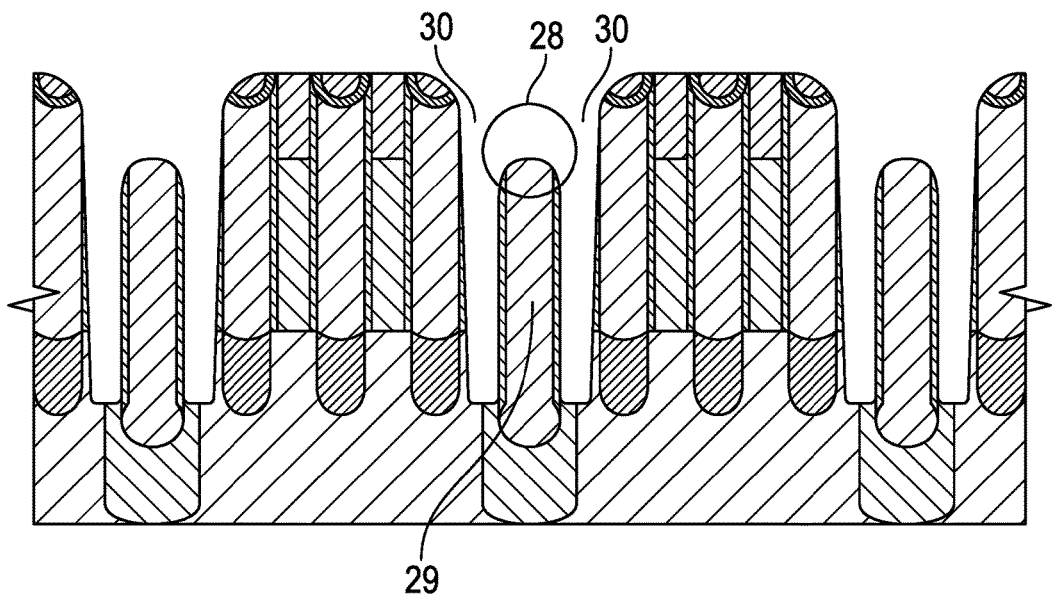

FIG. 2(h) shows the removal of dummy gate material to form recess 23. Note how in FIG. 2(i) portions 24 show the removal of dummy gate material while portion 25 shows a still intact and not overly recessed ILD under cap portions 26 (analogous to portion 20 in FIGS. 2(g)) and 27 (analogous to portion 21 in FIG. 2(g)). In contrast, FIG. 2(j) shows when dummy silicon is removed (areas 30) significant removal also occurs at area 28, leaving a shortened ILD portion 29, which will complicate downstream processing (e.g., S/D contact formation).

Please note that forming of the cap layer(s) (FIGS. 2(c)-2(e)) and/or cap elements (remnants of layers 20, 21 found in FIGS. 2(f) and 2(g)) can be used with smaller technology nodes because the formation of the protective elements is not conformal and is eventually produced with CMP. In contrast, older helmet processes (e.g., conformal deposition) pinch off as the polysilicon pitch is shrunk (e.g., conformal CVD would have difficulty getting between polysilicon portions 2 as CD decreases, thereby making protection of ILD 7 very difficult).

Please further note that by an embodiment incorporating thick transition metal oxide/nitride self-aligned to the feature requiring protection (i.e., no masking was done to align elements 20, 21 over ILD 7 in FIG. 2(g)), an embodiment allows for minimizing the topography during downstream processing. For example, with a traditional helmet process PVD goes on top of the region to be protected, thereby causing topography. However, in an embodiment after CMP is done there is no topography on the wafer—(i.e., top is flat).

Additionally, these oxides and/or nitride caps provide hard polish stops for many oxide and nitride slurries allowing for the ability to retain this protection until the underlying feature needs to be accessed. The cap can then be removed by a non-selective polish that greatly mitigates incoming topography in comparison to current protection schemes.

Figure 3B:
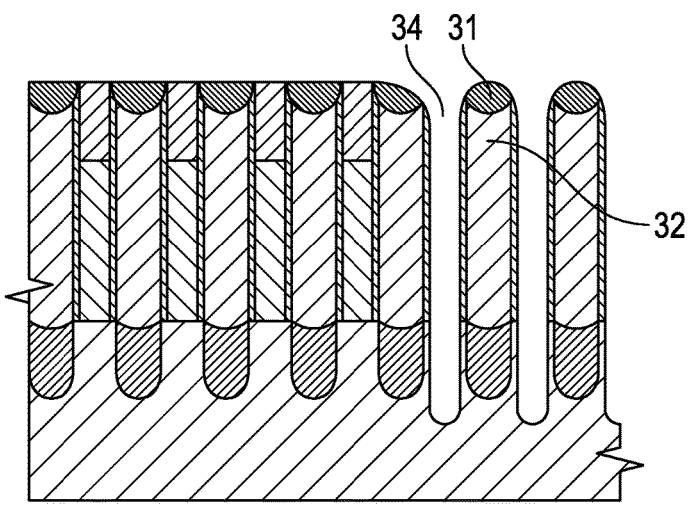

FIGS. 3(a)-(b) depict a helmet process in an embodiment. FIG. 3(a) is analogous to planarized FIG. 2(g), although instead of layers 20, 21 in FIG. 2(g), FIG. 3(a) uses a single cap layer 31 to protect ILD 32 during removal of polysilicon 33. Layer 31 includes a thickened HfOx layer (vertical height 72), whereas layers 20, 21 in FIG. 2(g) are each relatively thinner (20, 21 collectively are vertical height 71). FIG. 3(b) shows how cap 31 protects ILD 32 even after polysilicon is removed to form recess 34.

Figure 4:
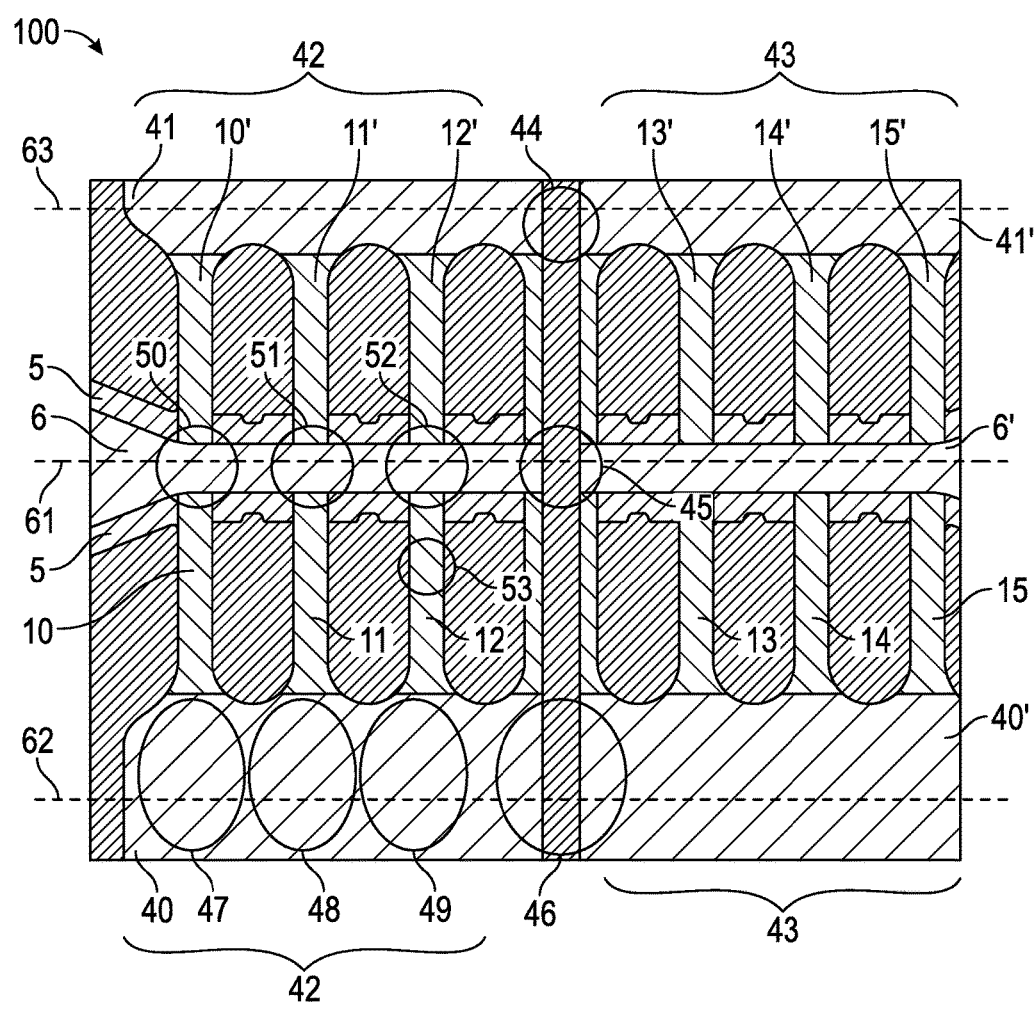
FIG. 4 depicts a FinFET system in an embodiment.

FIG. 4 depicts a FinFET system in an embodiment. System 100 includes fins 10, 10', 11, 11', 12, 12', 13, 13', 14, 14', 15, 15'. These fins couple to S/D contact pads 40, 41, gate 6, and spacers 5. In creating system 100, different portions of the active components may be separated or isolated from each other. For example, portion 42 may be electrically isolated from portion 43. This isolation may occur due to ILD being formed between portions 42, 43 at locations 44, 45, 46. In such a scenario, the cap (e.g., layers 20, 21 from FIG. 2(e)) that protected ILD portions during formation of gate portions 50, 51, 52, may have been removed during, for example, creation of contact portions 47, 48, 49. However, where no contact is formed (area 46), the cap may not be removed and may still be present in the finished product form of system 100. Furthermore, even in areas where a contact was formed, there may be elements of the cap that remain such as, for example, portion 53 (see also FIG. 5).

Figure 8:
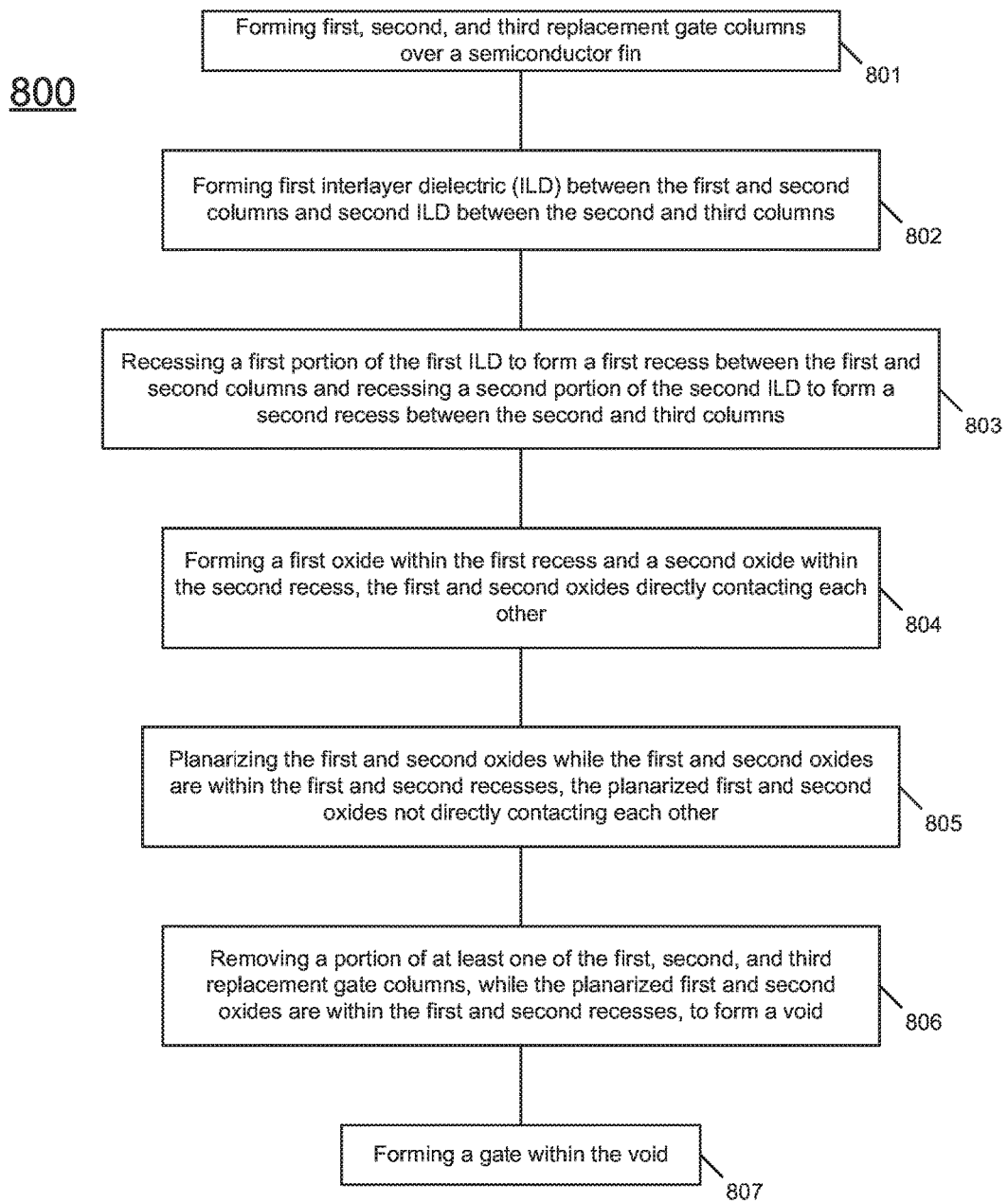
FIG. 8 includes a method in an embodiment.

FIG. 8 includes process 800. Process 800 includes forming first, second, and third replacement gate columns over a semiconductor fin (block 801); forming first interlayer dielectric (ILD) between the first and second columns and second ILD between the second and third columns (block 802); recessing a first portion of the first ILD to form a first recess between the first and second columns and recessing a second portion of the second ILD to form a second recess between the second and third columns (block 803); forming a first oxide within the first recess and a second oxide within the second recess, the first and second oxides directly contacting each other (block 804); planarizing the first and second oxides while the first and second oxides are within the first and second recesses, the planarized first and second oxides not directly contacting each other (block 805); removing a portion of at least one of the first, second, and third replacement gate columns, while the planarized first and second oxides are within the first and second recesses, to form a void (block 806); and forming a gate within the void (block 807).

Various embodiments include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

Figure 6:
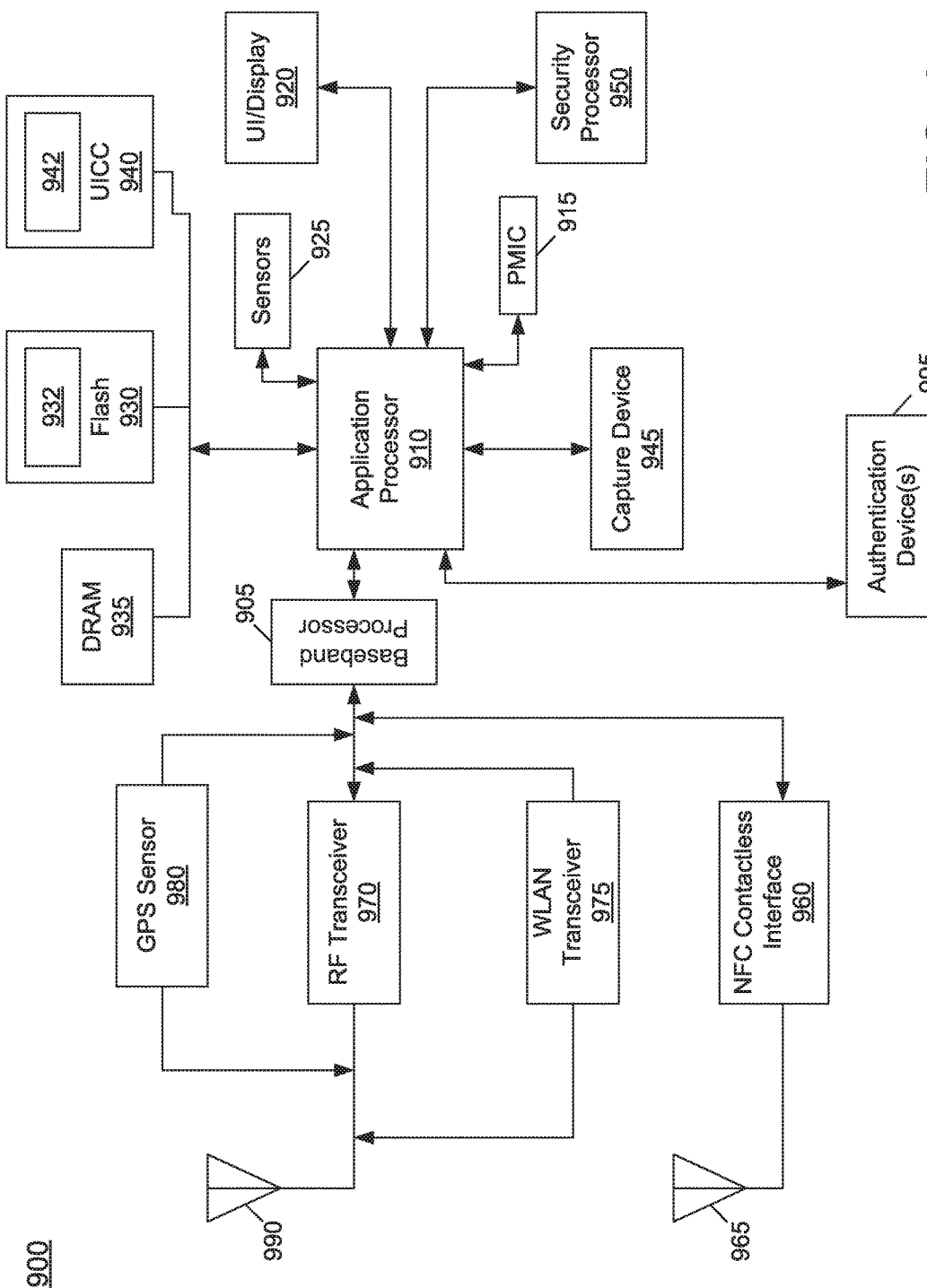
FIGS. 6 and 7 depict systems that include embodiments.

Referring now to FIG. 6, shown is a block diagram of an example system with which embodiments can be used. As seen, system 900 may be a smartphone or other wireless communicator or any other IoT device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 7:
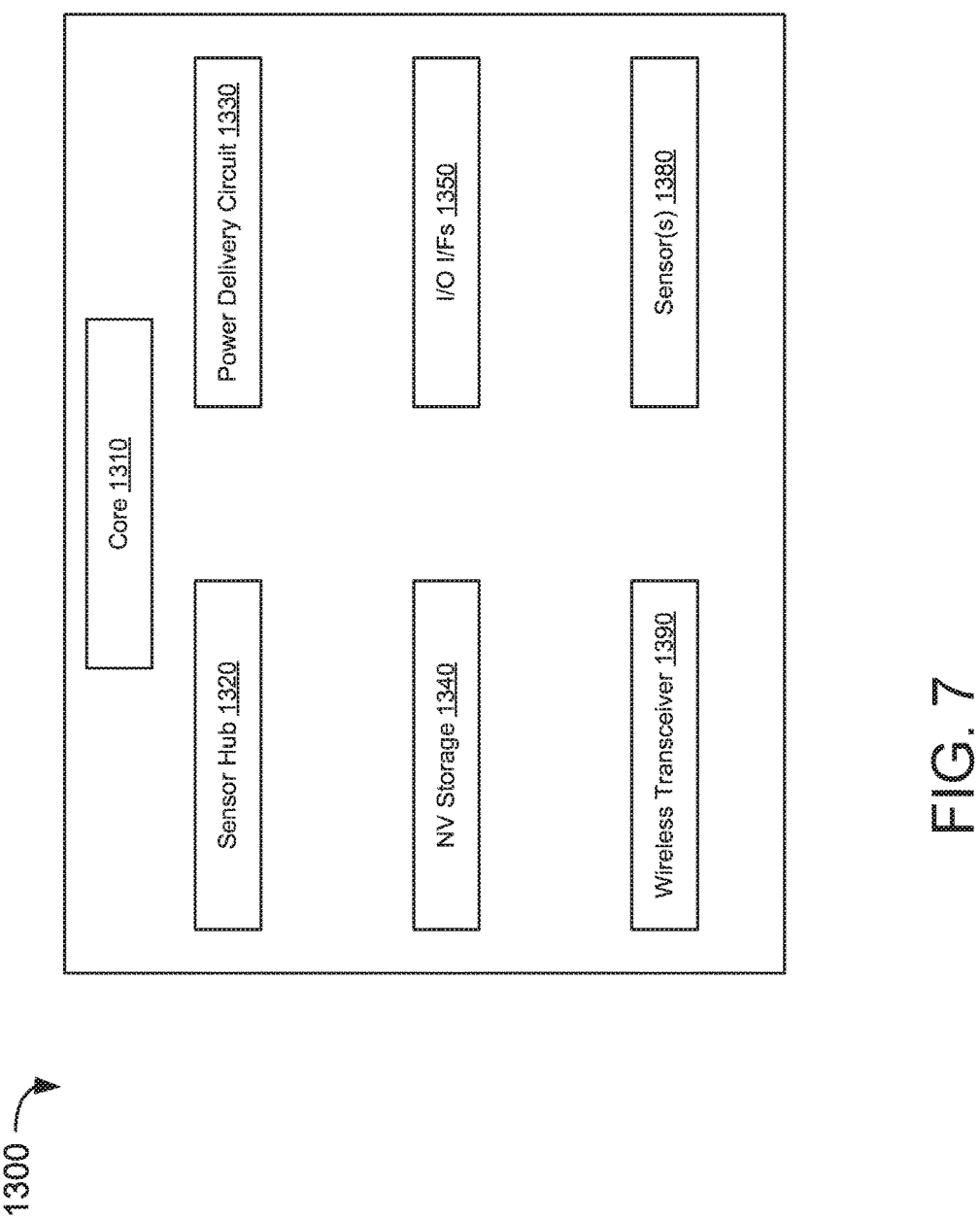

Embodiments may be used in environments where IoT devices may include wearable devices or other small form factor IoT devices. Referring now to FIG. 7, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340. In an embodiment, this circuit may include a rechargeable battery and a recharging circuit, which may in one embodiment receive charging power wirelessly. One or more input/output (10) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

Figure 5:
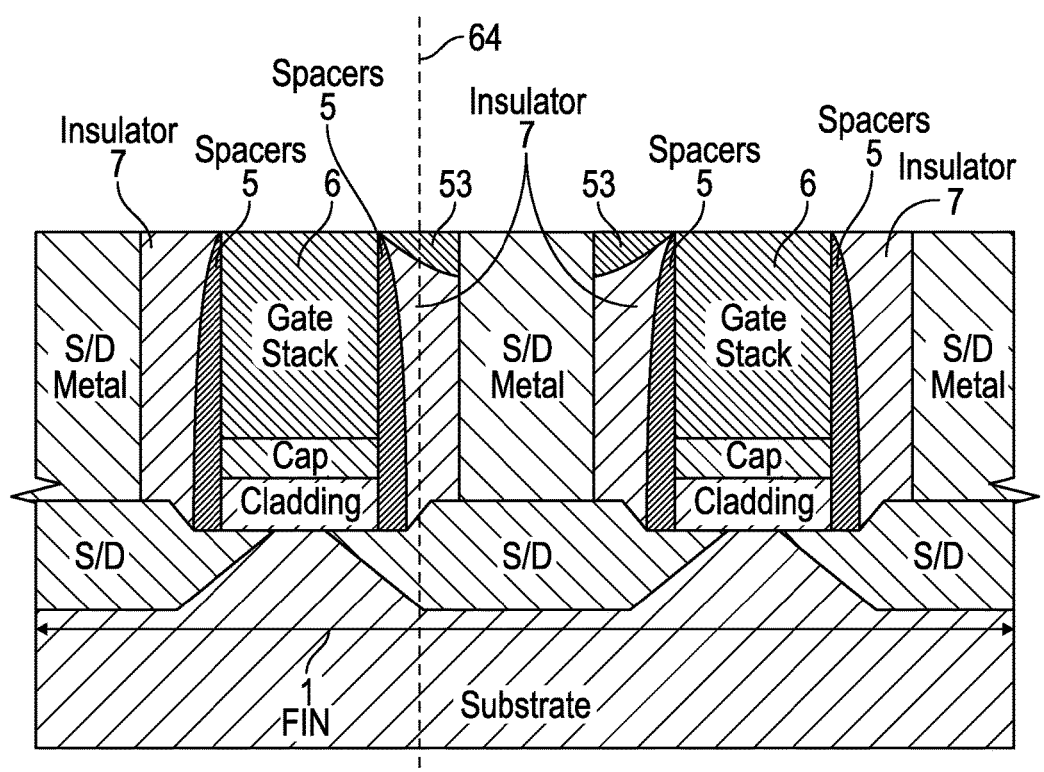
FIG. 5 depicts a FinFET system in an embodiment.

Considering the ubiquitous nature of transistors such as those of FIGS. 4 and 5, any or all of the components of FIGS. 6 (e.g., DRAM 935, processor 910) and 7 (e.g., sensor 1380, storage 134) may include embodiments of the cap or be made with embodiments of the cap process.

The following examples pertain to further embodiments.

Example 1 includes a system comprising: a first gate and a first contact both on a first fin; second gate and a second contact both on a second fin; and an interlayer dielectric (ILD) portion between the first and second contacts; wherein (a) the first and second gates are aligned along a first axis that is substantially orthogonal to the first and second fins, (b) the first and second contacts and the ILD portion are aligned along a second axis substantially parallel to the first axis; and (c) the ILD portion includes a recess that comprises a cap layer including at least one of an oxide and a nitride.

In example 2 the subject matter of the Example 1 can optionally include wherein the recess includes an additional cap layer directly contacting the oxide cap layer.

In example 3 the subject matter of the Examples 1-2 can optionally include wherein the oxide cap layer includes a parabolic bottom surface.

In example 4 the subject matter of the Examples 1-3 can optionally include wherein the first and second fins are on a substrate and a horizontal plane, orthogonal to a substrate, intersects the oxide cap layer and the first gate.

Example 5 includes a method comprising: forming first, second, and third replacement gate columns over a semiconductor fin; forming a first interlayer dielectric (ILD) between the first and second columns and a second ILD between the second and third columns; recessing a first portion of the first ILD to form a first recess between the first and second columns and recessing a second portion of the second ILD to form a second recess between the second and third columns; forming a first oxide within the first recess and a second oxide within the second recess, the first and second oxides directly contacting each other; planarizing the first and second oxides while the first and second oxides are within the first and second recesses, the planarized first and second oxides not directly contacting each other; removing a portion of at least one of the first, second, and third replacement gate columns, while the planarized first and second oxides are within the first and second recesses, to form a void; and forming a gate within the void.

In Example 6 the subject matter of the Example 5 can optionally include removing at least a portion of the planarized first oxide and at least a portion of the first ILD to form an additional void; and forming a contact for a transistor node within the additional void; wherein the transistor node includes one of a source and a drain.

In example 7 the subject matter of the Examples 5-6 can optionally include forming a capping layer within the first and second recesses; and planarizing the capping layer and forming planarized first and second portions of the capping layer within the first and second recesses, the planarized first and second portions of the capping layer not directly contacting each other.

In example 8 the subject matter of the Examples 5-7 can optionally include removing at least a portion of the planarized first portion of the capping layer to form the additional void.

In example 9 the subject matter of the Examples 5-8 can optionally include wherein the capping layer includes at least one of an oxide and a nitride.

Example 10 includes a system comprising: a first gate column, a first source contact column, and a first drain contact column all on a first semiconductor fin; a second gate column, a second source contact column, and a second drain contact column all on a second semiconductor fin; and a first interlayer dielectric (ILD) portion collinear with and between the first and second source contact columns and a second ILD portion collinear with and between the first and second drain contact columns; wherein (a) the first gate column is collinear with the second gate column, the first source contact column is collinear with the second source contact column, and the first drain contact column is collinear with the second drain contact column; (b) the first ILD portion includes a first recess and the second ILD portion includes a second recess; and (c) the first recess includes a first oxide cap layer and the second recess includes a second oxide cap layer.

For instance, FIG. 4 shows a first gate column 6, a first source contact column 40, and a first drain contact column 41 all on a first semiconductor fin 12, 12'; a second gate column 6', a second source contact column 40', and a second drain contact column 41' all on a second semiconductor fin 13, 13'; and a first interlayer dielectric (ILD) portion 46 collinear with and between the first and second source contact columns and a second ILD portion 44 collinear with and between the first and second drain contact columns; wherein (a) the first gate column is collinear (see axis 61) with the second gate column, the first source contact column is collinear (see axis 62) with the second source contact column, and the first drain contact column is collinear (see axis 62) with the second drain contact column; (b) the first ILD portion includes a first recess and the second ILD portion includes a second recess; and (c) the first recess includes a first oxide cap layer (layer 20) and the second recess includes a second oxide cap layer (layer 20).

In example 11 the subject matter of Example 10 can optionally include wherein the first oxide cap layer does not directly contact the second oxide cap layer.

In example 12 the subject matter of the Examples 10-11 can optionally include wherein the first recess includes a first additional cap layer directly contacting the first oxide cap layer and the second recess includes a second additional cap layer directly contacting the second oxide cap layer.

For instance, the additional cap layer may include layer 21.

In example 13 the subject matter of the Examples 10-12 can optionally include the first additional cap layer includes a substantially planar first top surface and the second additional cap layer includes a substantially planar second top surface; and the substantially planar first top surface is coplanar with the substantially planar second top surface.

In example 14 the subject matter of the Examples 10-13 can optionally include wherein the first additional cap layer includes at least one of an oxide and a nitride and the second additional cap layer includes at least one of an oxide and a nitride.

In example 15 the subject matter of the Examples 10-14 can optionally include wherein the first oxide cap layer includes a bottom surface that is parabolic in shape.

In example 16 the subject matter of the Examples 10-15 can optionally include wherein the bottom surface includes lateral portions that are above a middle portion of the bottom surface.

In example 17 the subject matter of the Examples 10-16 can optionally include a third ILD portion between the first source contact column and the first drain contact column; wherein the third ILD portion includes a third recess and the third recess includes a third oxide cap layer.

For instance, see area 53 in FIG. 5.

In example 18 the subject matter of the Examples 10-17 can optionally include wherein a vertical axis intersects the third recess and the first semiconductor fin.

For instance, see axis 64 in FIG. 5.

In example 19 the subject matter of the Examples 10-18 can optionally include wherein the third recess includes a third additional cap layer that includes at least one of an oxide and a nitride.

In example 20 the subject matter of the Examples 10-19 can optionally include wherein a horizontal plane intersects the first and third oxide cap layers.

In example 21 the subject matter of the Examples 10-20 can optionally include wherein a horizontal plane intersects the first, second, and third oxide cap layers.

In example 22 the subject matter of the Examples 10-21 can optionally include wherein a horizontal plane intersects the first and second oxide cap layers and the first gate column.

In example 23 the subject matter of the Examples 10-22 can optionally include wherein the first and second ILD portions each include ILD0.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A system comprising:
   a first gate and a first contact both on a first fin;
   a second gate and a second contact both on a second fin; and
   an interlayer dielectric (ILD) portion between the first and second contacts;
   wherein (a) the first and second gates are intersected by a first axis that is substantially orthogonal to long axes of the first and second fins, (b) the first and second contacts and the ILD portion are intersected by a second axis that is substantially parallel to the first axis; and (c) the ILD portion includes a recess that comprises a cap layer including at least one of an oxide, a nitride, or a combination thereof;
   wherein the cap layer is not monolithic with the ILD portion;
   wherein the long axis of the first fin defines a length of the first fin, a short axis of the first fin defines a width of the first fin, the short axis is shorter than the long axis, and a height of the first fin is orthogonal to the long and short axes of the first fin.

2. The system of claim 1, wherein the recess includes an additional cap layer directly contacting the cap layer.

3. The system of claim 1, wherein the cap layer includes a parabolic bottom surface.

4. The system of claim 1, wherein:
the first and second fins are on a substrate;
a plane, which is parallel to a surface of the substrate, intersects the cap layer and the first gate;
the surface of the substrate is between the substrate and the first gate.

5. A method comprising:
forming first, second, and third replacement gate columns over a semiconductor fin;
forming a first interlayer dielectric (ILD) between the first and second columns and a second ILD between the second and third columns;
recessing a first portion of the first ILD to form a first recess between the first and second columns and recessing a second portion of the second ILD to form a second recess between the second and third columns;
forming a first oxide within the first recess and a second oxide within the second recess, the first and second oxides directly contacting each other;
planarizing the first and second oxides while the first and second oxides are within the first and second recesses, the planarized first and second oxides not directly contacting each other;
removing a portion of at least one of the first, second, or third replacement gate columns or combinations thereof, while the planarized first and second oxides are within the first and second recesses, to form a void; and
forming a gate within the void.

6. The method of claim 5 comprising:
removing at least a portion of the planarized first oxide and at least a portion of the first ILD to form an additional void; and
forming a contact for a transistor node within the additional void;
wherein the transistor node includes one of a source or a drain.

7. The method of claim 5 comprising:
forming a capping layer within the first and second recesses; and
planarizing the capping layer and forming planarized first and second portions of the capping layer within the first and second recesses, the planarized first and second portions of the capping layer not directly contacting each other.

8. The method of claim 7, comprising removing at least a portion of the planarized first portion of the capping layer to form the additional void.

9. The method of claim 7, wherein the capping layer includes at least one of an oxide, a nitride, or combination thereof.

10. A system comprising:
a first gate column, a first source contact column, and a first drain contact column all on a first semiconductor fin;
a second gate column, a second source contact column, and a second drain contact column all on a second semiconductor fin; and
a first interlayer dielectric (ILD) portion collinear with and between the first and second source contact columns and a second ILD portion collinear with and between the first and second drain contact columns;
wherein (a) the first gate column is collinear with the second gate column, the first source contact column is collinear with the second source contact column, and the first drain contact column is collinear with the second drain contact column; (b) the first ILD portion includes a first recess and the second ILD portion includes a second recess; and (c) the first recess includes a first oxide cap layer and the second recess includes a second oxide cap layer.

11. The system of claim 10, wherein the first oxide cap layer does not directly contact the second oxide cap layer.

12. The system of claim 11, wherein the first recess includes a first additional cap layer directly contacting the first oxide cap layer and the second recess includes a second additional cap layer directly contacting the second oxide cap layer.

13. The system of claim 12, wherein:
the first additional cap layer includes a substantially planar first top surface and the second additional cap layer includes a substantially planar second top surface; and
the substantially planar first top surface is coplanar with the substantially planar second top surface.

14. The system of claim 13, wherein the first additional cap layer includes at least one of an oxide, a nitride, or a combination thereof and the second additional cap layer includes at least one of an oxide, a nitride, or a combination thereof.

15. The system of claim 14, wherein the first oxide cap layer includes a bottom surface that is parabolic in shape.

16. The system of claim 15, wherein the bottom surface includes lateral portions that are above a middle portion of the bottom surface.

17. The system of claim 11 comprising a third ILD portion between the first source contact column and the first drain contact column; wherein the third ILD portion includes a third recess and the third recess includes a third oxide cap layer.

18. The system of claim 17, wherein a vertical axis intersects the third recess and the first semiconductor fin.

19. The system of claim 18, wherein the third recess includes a third additional cap layer that includes at least one of an oxide, a nitride, or a combination thereof.

20. The system of claim 19, wherein a horizontal plane intersects the first and third oxide cap layers.

21. The system of claim 19, wherein a horizontal plane intersects the first, second, and third oxide cap layers.

22. The system of claim 11, wherein a horizontal plane intersects the first and second oxide cap layers and the first gate column.

23. The system of claim 11, wherein the first and second ILD portions each include ILD0.

* * * * *